United States Patent
Doris et al.

(10) Patent No.: US 8,436,759 B2
(45) Date of Patent: May 7, 2013

(54) ADC

(75) Inventors: Konstantinos Doris, Amsterdam (NL); Erwin Janssen, Veldhoven (NL)

(73) Assignee: NXP B.V., Eindhoven (NL)

( * ) Notice: Subject to any disclaimer, the term of this patent is extended or adjusted under 35 U.S.C. 154(b) by 104 days.

(21) Appl. No.: 13/123,610

(22) PCT Filed: Oct. 5, 2009

(86) PCT No.: PCT/IB2009/054346
§ 371 (c)(1),
(2), (4) Date: Apr. 11, 2011

(87) PCT Pub. No.: WO2010/044000
PCT Pub. Date: Apr. 22, 2010

(65) Prior Publication Data
US 2011/0241912 A1    Oct. 6, 2011

(30) Foreign Application Priority Data

Oct. 13, 2008  (EP) .................................... 08105557

(51) Int. Cl.
*H03M 1/12*    (2006.01)
(52) U.S. Cl.
USPC .......................................... 341/155; 341/156
(58) Field of Classification Search .................. 341/155, 341/156, 162, 161, 122, 120, 160, 172, 118
See application file for complete search history.

(56) References Cited

U.S. PATENT DOCUMENTS 5,065,351 A * 11/1991 Johnston et al. ............... 702/107
6,850,181 B1   2/2005 Tsinker
6,958,722 B1  10/2005 Janakiraman et al.

(Continued)

FOREIGN PATENT DOCUMENTS

DE   103 51 384 A1   6/2005
WO   2009/090514 A1  7/2009

OTHER PUBLICATIONS

Sauerbrey, J., et al., "A 0.5V, 1µW Successive Approximation ADC", (IEEE) ESSCIRC 2002, pp. 247-250 (2002).
Louwsma, S., et al. "A 1.35 GS/s, 10b, 175 mW Time-Interleaved AD Converter in 0.13 µm CMOS", IEEE J. of Solid-State Circuits, vol. 43, No. 4, pp. 778-786 (Apr. 2008).

(Continued)

*Primary Examiner* — Joseph Lauture

(57) ABSTRACT

This invention relates to Analog to Digital Converters (ADC) and, inter alia, to Time Interleaved ADCs and Successive Approximation Register (SAR) ADC's. In a conventional Time Interleaved ADC employing SAR ADC units, the input signal is processed through a track-and-hold circuit (T/H), and then through a buffer circuit, before the SAR ADC unit. There, by means of a comparator, the signal is compared with a Digital-to-Analog Converter (DAC) signal from the SAR logic. The buffer reduces the influence of capacitive loading and physical layout design on the SAR ADC input, but typically has a non-linear response and thus introduces distortion to the input signal. This can limit the ADC linearity, particularly for high-speed ADCs operating with low-supply voltages. An objective of the invention is to reduce or eliminate the effect of the buffer non-linearity. This is done in some embodiments by routing both the signals to the comparator through the same buffer circuit. In another embodiment the DAC signal is routed through a separate second buffer circuit. By use of a single buffer circuit, or where there is ideal matching of the buffer circuits in the latter embodiment, the distortion effects are completely eliminated; however, for practical imperfectly matched buffer circuits according to the latter embodiment, the gain and off-set mismatches can be accommodated through calibration of the buffers or, in suitable applications, through the DAC calibration.

20 Claims, 8 Drawing Sheets

U.S. PATENT DOCUMENTS

| | | | |
|---|---|---|---|
| 7,015,853 | B1 | 3/2006 | Wolff et al. |
| 7,649,485 | B1 * | 1/2010 | Kaplan ......................... 341/155 |
| 2004/0263366 | A1 | 12/2004 | Yada et al. |
| 2005/0285770 | A1 | 12/2005 | Ye |

OTHER PUBLICATIONS

International Search Report and Written Opinion for Int'l. Patent Appl. No. PCT/IB2009/054346 (Feb. 24, 2010).

* cited by examiner

ADC

FIELD OF THE INVENTION

This invention relates to Analog-to-Digital Converters (ADC), and in particular to ADCs which comprise pre-conditioning units such as buffers

BACKGROUND OF THE INVENTION

An ADC 10 is shown in FIG. 1. This example ADC is a Successive Approximation Register ADC (SAR-ADC). The ADC input is connected to a track-and-hold unit 11. A comparator 13 compares the input held in the track-and-hold unit 11 with the value output from a Digital-to-Analog Converter (DAC) 12. The comparator output is input to the SAR logic 14, which provides both the ADC output and the input to the DAC 12.

The converter works with the binary search algorithm. First, the input signal is applied and compared with half the scale of the signal reference (thus, the 100 ... 00). Dependent on the comparison result, the DAC output value is increased or reduced in binary levels to approximate successively the input signal. For a 10 bit (10b) SAR ADC, a minimum of 10 successive cycles is needed. At this point the approximation has finished and the loaded DAC value represents the digitized value of the input signal. The comparator 13 often incorporates internally a pre-amplification stage that amplifies the difference between the signal input and the DAC signal before determining the sign of this difference.

In a particularly popular implementation of SAR ADCs, the DAC is implemented with Switched Capacitors (SC) and is combined with the SAR ADC's re-sampling capacitor. FIG. 2 shows a basic schematic of this approach, in which a plurality of capacitors C1, C2 . . . Cn are switchably connected to the input—that is, they are connected to the input with use of switches, and function both as re-sampling capacitors, and as the DAC. Although many implementations exist, the basic principle remains the same.

One of the advantages of the switch capacitor implementations for the SAR ADC is, by combining the sampling capacitor and the feedback DAC into one capacitor network, area and eventually power can be saved. The operation is as follows: in the sampling phase the bottom plates of all the capacitors are connected to the input signal while switch Sp is closed grounding the top plates. Once the signal is sampled, Sp is opened and all the bottom plates are grounded causing the top plated to become equal to the negative of the sampled input voltage (since charge must be conserved). The conversion proceeds by connecting one by one the bottom plate capacitors having binary weights to a reference voltage Vref. Due to charge redistribution the top plate changes values until step-by-step it eventually comes back to zero. At this moment, the original setting has been restored and the code loaded on the DAC is the digitized equivalent of the input signal.

FIG. 3 shows a time interleaved ADC incorporating SAR ADCs. The signal input is connected to a plurality of track and hold units T/H, each of which is associated with a single SAR ADC unit 32. The outputs from the SAR ADC units are combined in a data recombination unit 33, to produce an output stream. The T/H units are controlled by means of local clock signals 34.

When one incorporates SAR ADC's in a Time-Interleaved ADC as shown in FIG. 3, there are additional constraints being placed on the SAR ADC. Consider for example 16 slow 10-bit SAR ADC's running each at 50 MS/sec. The time-interleaved algorithm would in theory allow an effective rate of 800 MS/sec. Because the slow SAR ADC's have limited input bandwidth for sampling (e.g. 25 MHz), additional dedicated (high-speed) track-and-hold circuits (T/H) are needed (often, but not always, one T/H per SAR ADC) to provide to each SAR ADC unit a well-settled signal. The SAR ADC incorporates its dedicated means to re-sample this signal (as in FIG. 3) and proceed further with the conversion.

Because all SAR ADC's process the same input signal, the distribution of the input signal from the input source via the high-speed T/H to each individual SAR ADC inputs creates a significant interconnection wire overhead, leading to bandwidth limitations. It can also create different signal delays from one SAR ADC unit to the other, which reflect to performance degradation. Capacitive loading of the SAR ADC input stages reduce the input bandwidth even further.

To overcome the bandwidth limitations, the high speed T/H usually incorporates a dedicated source follower, or buffer, or more generally an amplifier circuit with gain A that is higher or lower than unity. This is shown in FIG. 4. In FIG. 4, the input is directed to each of a plurality of T/H units 11. Between each T/H unit 11 and its associated SAR ADC (having its own DAC 12, comparator 13 and SAR logic 14) is connected a buffer or follower 45. The buffer or follower 45 reduces effectively the capacitive loading between the high speed T/H and the far-away placed SAR ADC, and makes any capacitive differences in the paths between high-speed T/Hs and unit SAR ADCs (the capacitors C shown in FIG. 4) less significant, as regards the ADCs overall accuracy.

This amplifier (or buffer or follower) improves significantly the conversion but in return causes non-linear distortion to the signal; the DAC feedback signal is now compared to a signal that is distorted by the compressive behavior of the amplifier. The distortion becomes higher for large input signals, and significantly more important for high-resolution levels.

The problem just described becomes a performance-limiting factor in modern submicron CMOS processes (e.g. 65 nm) with low supply voltages. It becomes increasingly difficult in these processes to realize such buffers that offer broad signal bandwidth (e.g. GHz), very high linearity (e.g. Total-Harmonic-Distortion of −60 dB, or less) and high signal swing (e.g. 0.5-1V), the last being required to reduce the noise impact on the signal quality.

Although this problem can be addressed by means of optimizing the circuit topology of the amplifier/buffer circuit for the combination of linearity, bandwidth, voltage swing and power consumption, there remains an ongoing need for an ADC which is able to at least to some extent reduce or ameliorate the problem of distortion in the amplifier, buffer, or follower.

SUMMARY OF THE INVENTION

It is an object of the present invention to provide an ADC which does not suffer to the same extent, from the above, or associated, problems.

According to the invention there is provided an ADC comprising an ADC element having a device input, the ADC element comprising an ADC unit, a pre-conditioning unit connected between the input and the ADC unit, and a DAC unit having a DAC output characterised in that the ADC element further comprises a signal selector unit connected between the input and the ADC unit and in series with the pre-conditioning unit and for selecting one of an element input signal and a signal from the DAC output and in that the ADC unit comprises at least one memory element.

In an embodiment, the signal selector unit is connected between the input and the pre-conditioning unit. Also, preferably, the ADC unit is a successive approximation register ADC unit.

In an embodiment, the pre-conditioning unit is a buffer unit. Alternatively and without limitation, the pre-conditioning unit is an amplifier unit.

In an embodiment, the DAC comprises a current-mode DAC. Alternatively and without limitation, the DAC comprises a switched-capacitor DAC or the DAC comprises a resistor-string DAC In an advantageous embodiment, the ADC is further comprising a track-and-hold unit connected to the signal selector and for receiving the device input (Vin) and for supplying the element input signal.

Preferably, the ADC comprises a time-interleaved ADC. Such ADCs are particularly suited for use according to the invention since they are well-suited to high-speed operation, and the invention is particularly efficacious for high-speed operation.

Preferably in such a time-interleaved ADC the track-and-hold unit is for supplying the element input signals to each of a plurality of ADC elements. Also preferably, in such a time-interleaved ADC a plurality of track-and-hold units is each for supplying the element input signal to one or more ADC elements. Thus the invention is applicable to partitioned or hierarchical time-interleaved ADC.

In an alternative, non-limiting embodiment, the signal selector unit is connected between the pre-conditioning unit and the ADC unit, and the ADC further comprises a second pre-processor unit. Such an ADC may be a time-interleaved ADC and the ADC unit may be a successive approximation register ADC unit. This embodiment is particularly advantageous in that it offers a better speed of operation, than other embodiments, particularly for those cases where the speed limitation comes from the long feedback path.

Beneficially, in addition to the linearity improvements that may result from embodiments of the invention, embodiments of the invention can result in more degrees of design freedom for the amplifier requirements: since there is no longer the need to satisfy linearity within the amplifier, the design optimization need consider only bandwidth and voltage headroom. This in return brings a significant power advantage compared to an optimization where linearity is taken into account, and thereby allows the Time Interleaved converter to reach higher speed.

Without limitation, the invention finds particular application in modern CMOS technologies where broadband, highly linear buffer or amplifier circuits which achieve low power consumption and large voltage swings, are difficult to realise.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which.

Figure 1:
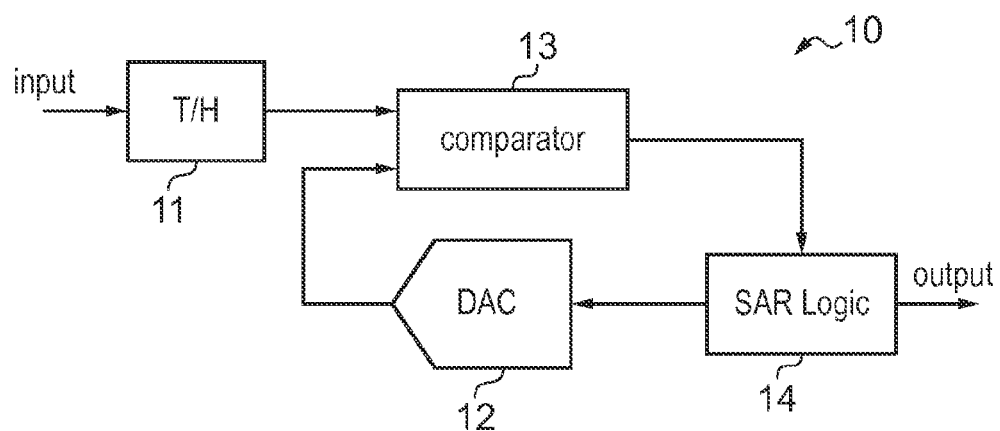
FIG. 1 is a schematic of the basic architecture of a Successive Approximation Register ADC.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

Figure 5:
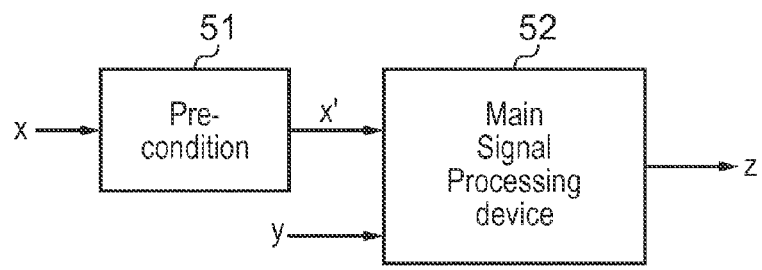
FIG. 5 shows the configuration of a main signal processing device and preconditioning unit.

In order to aid an understanding of the invention, it will be helpful to consider a source of inaccuracies which ADCs according to embodiment of the invention can reduce or ameliorate: in signal processing systems such as Analog-to-Digital converters, main signal processing devices 52 such as the one shown in FIG. 5 form basic parts of conversion algorithms processing a multiplicity of input signals x, y, . . . to generate signal z. A comparator is an example of a main processing device comparing signals x and y and generating the result z.

Often, signals x and y have significantly different electrical properties, e.g. common mode level, or the circuits that generate them cannot directly interface with the main processing device. In these cases, these signals must be pre-conditioned before being processed by the main device. This is shown in FIG. 5, assuming that signal x requires pre-conditioning by pre-conditioner 51 resulting in x'. Signal x', instead of x, will now be processed with y by the main signal processing device 52.

As a result of unwanted non-ideal behaviour of the pre-condition device, this extra processing may cause unwanted distortion of the signal x. For example, the signal x is buffered and amplified, but the compressive physical behaviour of the buffering unit causes third order harmonic distortion to the signal x reflected to x'. Signal z will now be the result of the processing between signals y and x', which is the processed (and distorted) version of signal x. Considering the previous example, if the main processing device is a comparator, then the compression added to signal x may cause errors in the comparison of x with y. A specific manifestation of this problem appears in Time-Interleaved ADC's using Successive-Approximation ADC units.

In embodiments of the invention, both signals x and y are subjected to the same or similar nonlinear behavior before they are both processed by the main signal processing device. According to embodiments of the invention, the processing of both signals is made in sequential phases such that both are processed through the same nonlinear device.

This is achieved using a signal selector and corresponding memory elements. The signal x initially is selected by the signal selectors to go through the nonlinear device and the result is stored in a memory element just before the main processing device. Once this phase is completed, the selector directs signal y to undergo the same processing and be again stored in a memory. The two stored signals can now be processed.

Referring to the SC SAR ADC specific error mechanism described above, one applies this method bringing the DAC feedback signal to the input of the signal buffer or amplifier, such that both the feed-forward sampled signal and the DAC feedback signal are subject to the same compressive behavior. The re-sampling capacitor of the SC DAC will play the role of the memory. While the SAR ADC re-samples the settled input signal provided by the front-end T/H the DAC feedback signal is not needed. After the high-speed T/H goes in the hold mode, the DAC feedback signal can be directed to the follower with the proper use of a signal selector (a multiplexer). The multiplexer implementation adds minimal distortion, thereby making this approach a very effective way of removing the nonlinearity of the amplifier.

Figure 6:
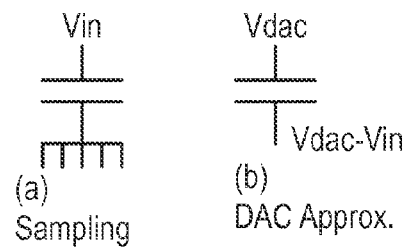
FIG. 6 shows at FIG. 6(a) the sampling configuration and at FIG. 6(b) the DAC approximation reconfiguration, of a single capacitor used within a SAR ADC unit.

In SAR ADC implementations according to the prior art, the DAC function is merged with the sampling function of the SAR ADC. In contrast, embodiments of the invention are based on a slightly different implementation of the SAR ADC. Instead of using a bank of capacitors binary scaled to perform both the sampling and DAC functions, one capacitor only, need be or is used. This is shown in FIG. 6, and it allows using two distinct signal paths to load the capacitor. In other words, the DAC circuit is kept apart from the (re-) sampling circuit.

Figure 3:
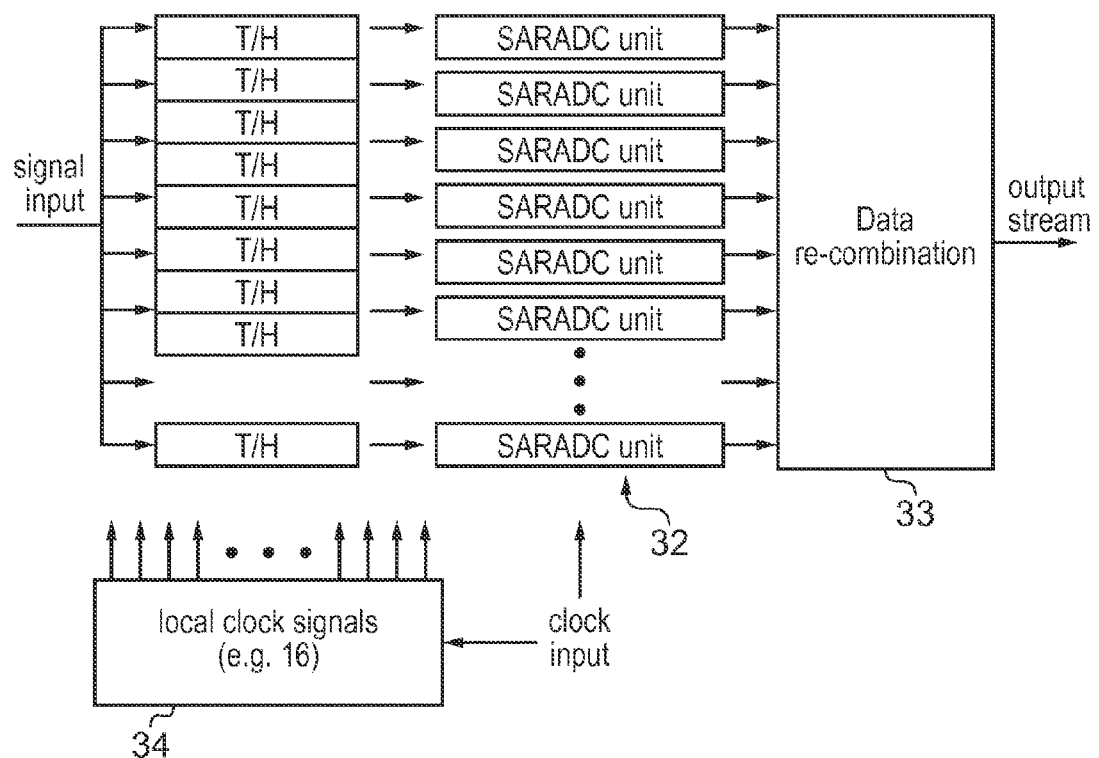
FIG. 3 shows schematically the configuration of a time interleaved ADC having a plurality of SAR ADC units, and dedicated high-speed T/H units.
Figure 4:
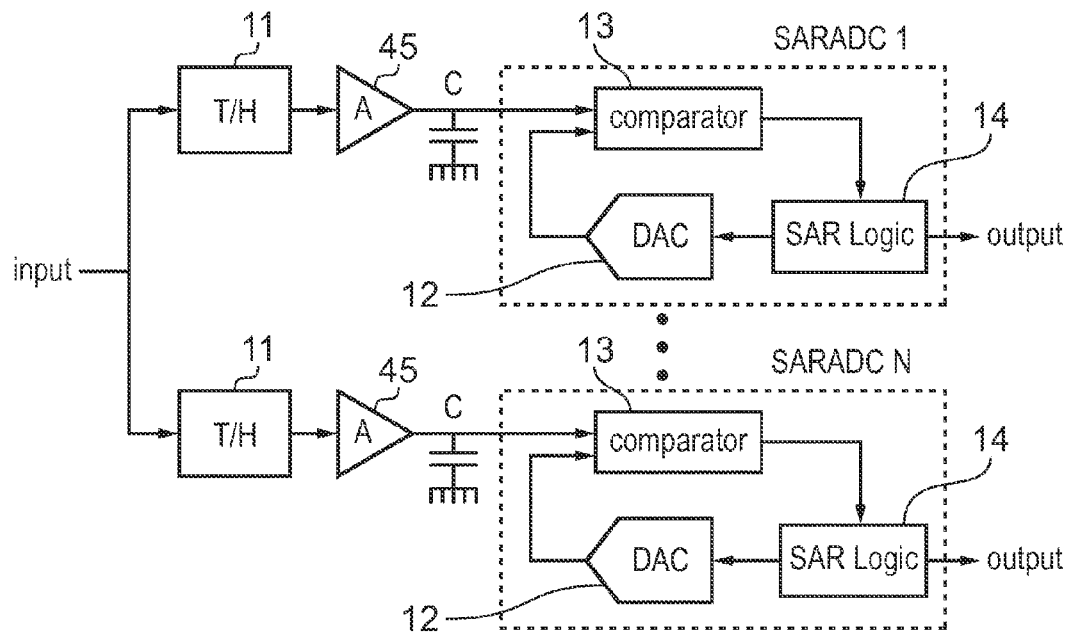
FIG. 4 shows schematically an ADC with a plurality of element SAR ADCs, each having a dedicated buffer and T/H unit.

The normal operation of a SAR ADC using this approach would then be: during sampling phase (a), as shown in FIG. 6(a) (which corresponds to re-sampling when applied to the TI ADC as shown in FIG. 3) the capacitor top plate is connected to the input source (Vin) and its bottom plate to the ground. This samples the signal and stores it in this single capacitor. In the approximation phase (b) shown in FIG. 6(b), the top plate is disconnected from the signal source, and is connected to the DAC signal Vdac while the bottom-plate is left floating. The result of the charge re-distribution is that the floating bottom-plate will now be shifted to Vdac-Vin, providing the difference signal. As a next step of the conversion algorithm, the signal Vdac-Vin is applied to a comparator to determine the sign of the comparison, and subsequently the next Vdac value.

Figure 2:
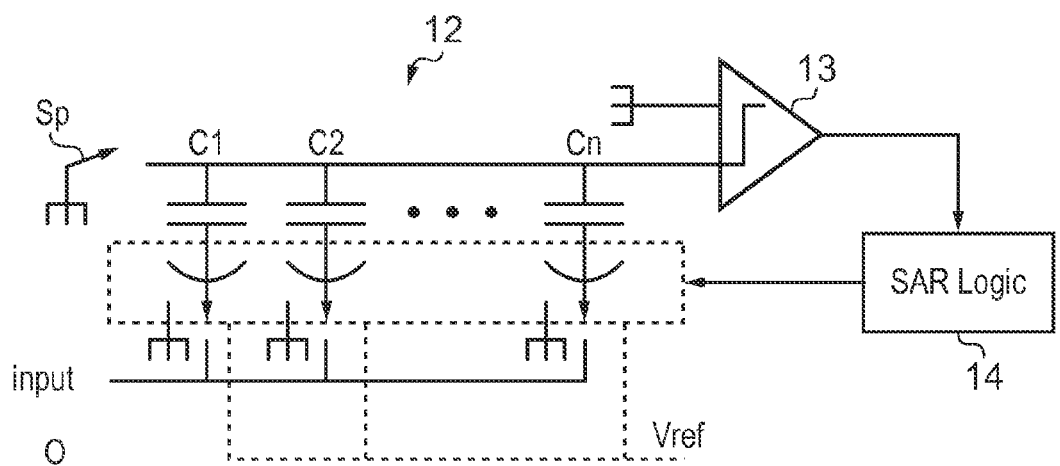
FIG. 2 is a schematic illustrations showing charge redistribution in an SAR ADC.

Since the DAC function is not embodied in the sampling network as in FIG. 2, it needs to be provided separately with the use of a dedicated DAC, e.g. a current-mode DAC driving a resistor load, or a resistor-string DAC. Thus, without limitation, the invention is appropriate for utilising any SAR ADC with a DAC whose output signal can be processed before subtracted/amplified together with the sampled signal.

Figure 7:
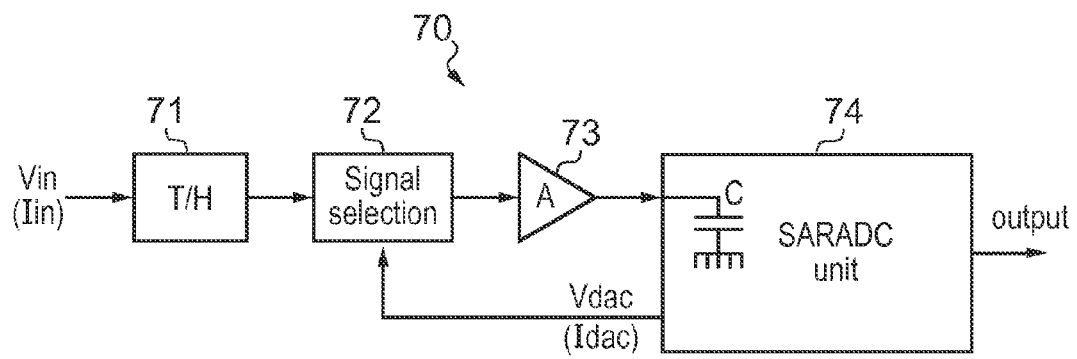
FIG. 7 shows schematically an ADC according to a first embodiment of the invention.

A schematic diagram of an ADC configured according to a first embodiment of the invention is shown in FIG. 7. The figure shows an ADC element 70. Input voltage Vin is held in T/H unit 71, and routed by means of signal selection unit 72 to the buffer or follow or amplifier, 73. Hereinafter the buffer or follower or amplifier will be referred to as the amplifier, but it will be appreciated that the amplifier may operate as a buffer or follower having unity, or near unity gain, or a gain which is greater or less than unity. The amplifier routes the signal to the SAR ADC unit 74, which processes the signal. The SAR ADC unit incorporates capacitor C, and, in addition to producing the ADC unit output, it returns a signal Vdac corresponding to the DAC output to the signal selection unit 72.

Thus, according to this embodiment of the invention, one can direct the Vdac signal via the same buffer that amplifies (and distorts) the input signal, achieving therefore the same compression for both Vdac and Vin. This is easily achieved using an additional analog selection circuit (e.g. analog multiplexer) at the input of the input signal buffer. The signal selector can be realized with simple switches, thereby adding minimal extra distortion to the signal. During the sampling phase (a) the input signal is allowed to pass in the SAR ADC which samples it according to the method shown in FIG. 6. In the DAC approximation phase (b) the Vdac is allowed to pass again following the steps shown in FIG. 6, and the input signal is routed to the next SAR ADC in the Time Interleaved converter.

In order to process the signal, the ADC unit 74 comprises one or more memory elements. The memory elements or elements (shown illustratively as capacitor C in the Figure) holds the amplified input signal whilst the return signal Vdac is routed through the buffer or amplifier. By this means, the embodiment enables the same amplifier to be used, sequentially, for both the input signal and the return of the DAC signal.

Since both input signal and feedback signal are now compressed in the same way, the result of the subsequent comparison at the SAR internal comparator won't change due to the compression. This means that the compression effect on linearity is greatly or even completely eliminated.

This embodiment of the invention has been described in relation to voltage signals, Vin, Vdac. Alternatively, the ADC may operate using currents or charges. Thus, as a non-limiting example, the input voltage Vin may be replaced by input current Iin, and the DAC voltage-representative signal Vdac, may be replaced with a current-representative signal Idac, as indicted in parentheses in FIG. 7. Not only may the embodiment shown in FIG. 7 may be adapted to operate in this way, but also other embodiments as will be described hereunder.

Figure 8:
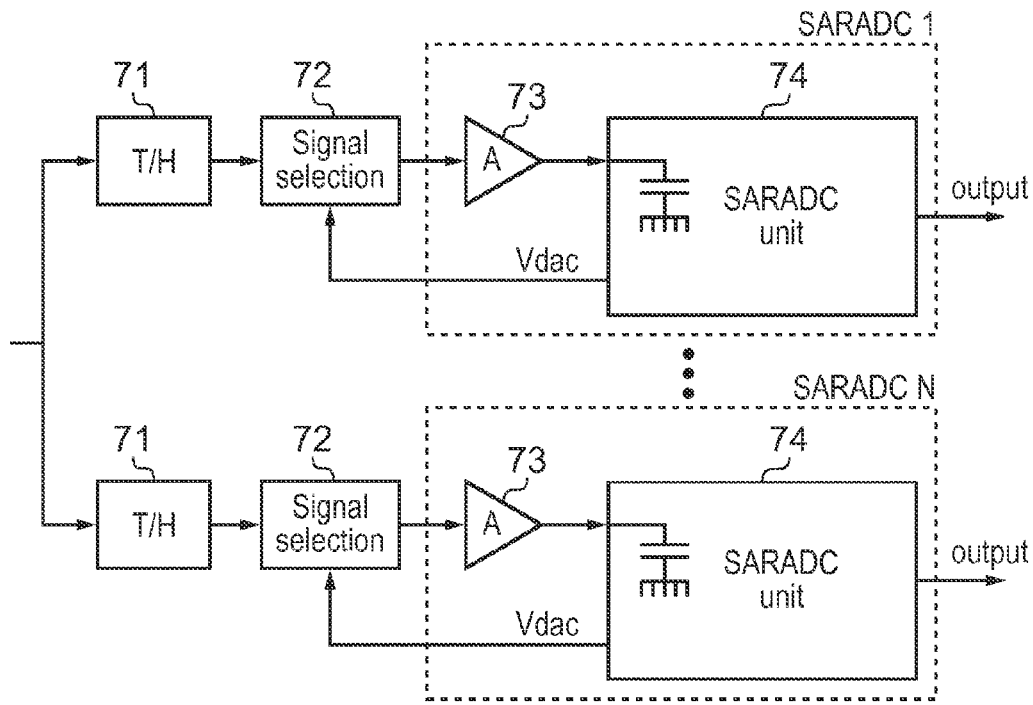
FIG. 8 shows schematically an ADC according to a further embodiment of the invention.

A schematic diagram of a further embodiment of the invention is shown in FIG. 8. FIG. 8 shows the invention applied to a conventional time interleaved ADC. This embodiment comprises a plurality of ADC elements 70, each of which are arranged in a similar fashion to that shown in FIG. 7. Like numerals are therefore used for like elements. Thus the signal selection units 70 are each arranged to select either the input voltage signal Vin which is held in T/H unit 71, or the return voltage of the DAC, Vdac which is returned from the SAR ADC unit 74; the selected signal is amplified through amplifier 73, before being input into SAR ADC unit 74 for processing. This embodiment differs from that shown in FIG. 7 only in that there are a plurality of ADC elements 70. Time interleaving logic (not shown) is included in order to route the input signal Vin successively to the various ADC elements 70.

Figure 9:
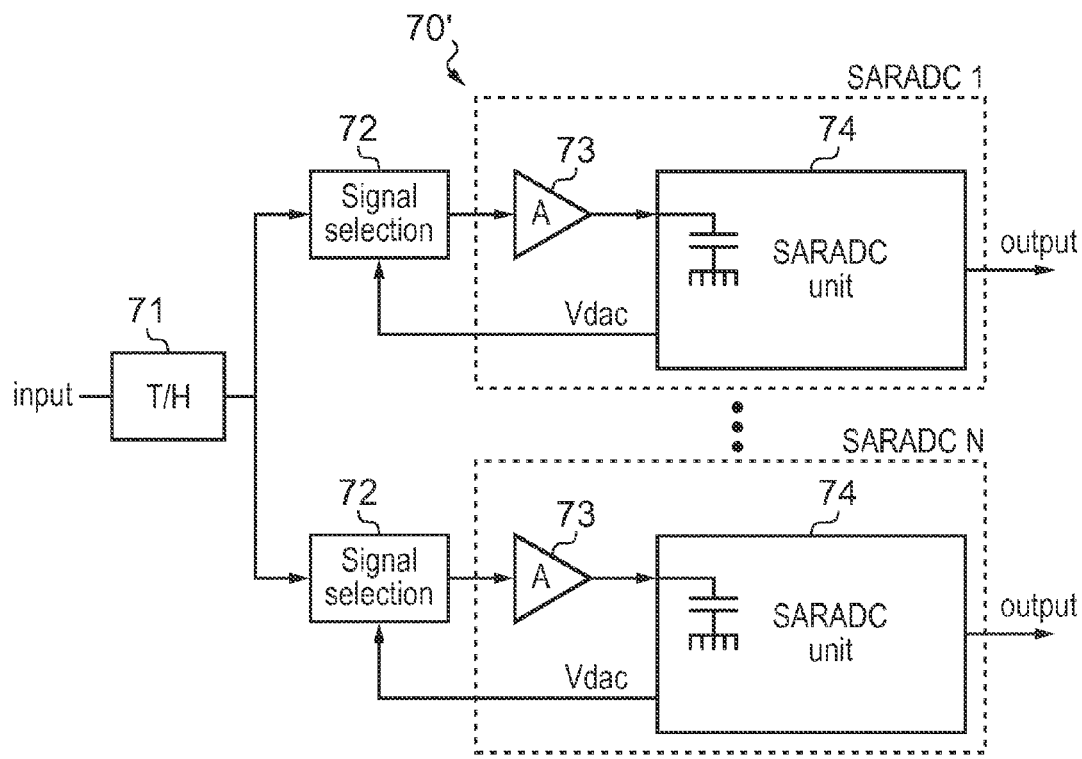
FIG. 9 shows schematically an ADC according to another embodiment of the invention.

A yet further embodiment of the invention is shown in schematic form in FIG. 9. This embodiment shows an application of the invention to a time interleaved ADC which incorporates a single T/H unit. As in the previous embodiment, like numerals refer to like components. In this embodiment, the input signal is routed into a single T/H unit 71. The time interleaving logic, required in order to multiplex the signal to the various ADC elements 70', is arranged to multiplex the output from the T/H circuit, rather than the input as in the previous embodiment. The individual ADC elements 70' in this embodiment do not require separate T/H units 71 but do comprise respective signal selection units 72, amplifiers 73 and SAR ADC units 74

Figure 10:
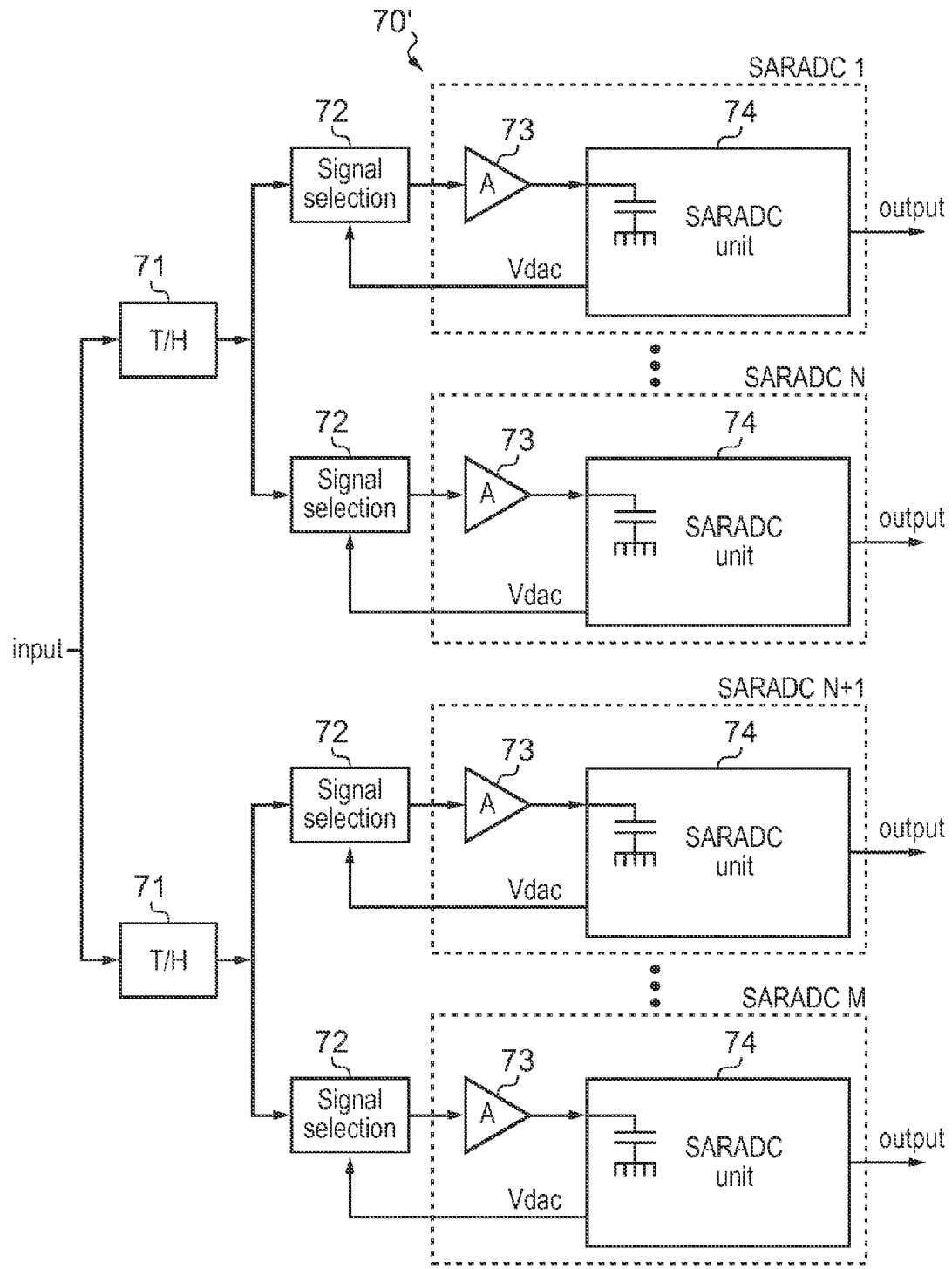
FIG. 10 shows schematically an ADC according to a yet further embodiment of the invention.

It is also possible to apply the invention to be partitioned or hierarchical time interleaved ADC. This type of ADC corresponds to a combination of the ADCs shown in the previous two embodiments, and is illustrated in FIG. 10. As above, like numerals reference like elements. This embodiment comprises a plurality of track and holds circuits, 71, each of which provides the input to a plurality of ADC elements 70'.

Figure 11:
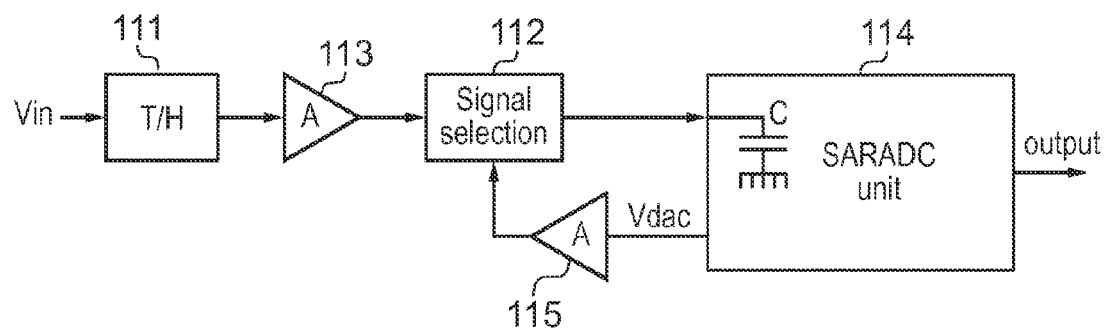
FIG. 11 shows schematically an ADC according to another embodiment of the invention.

Another embodiment of the invention is shown in FIG. 11. The main difference compared with the previous embodiments is that in this embodiment two amplifier units are used and the signal selector is differently located, not routing the DAC output signal via the same amplifier as the input signal. Thus, as shown in FIG. 11, a T/H unit 111 routes input voltage Vin direct to amplifier 113. The signal selection unit 112 routes either the output of amplifier 113, or the DAC return signal Vdac which has been amplified by second amplifier 115, to SAR ADC unit 114. Similarly to amplifier 113, amplifier 115 may equally be a buffer or follower unit. As in the previous embodiments, the sampling capacitor C may be integral to the SAR ADC unit 114.

In this embodiment, assuming ideal matching between the two amplifiers, nonlinearity removal will be achieved identically compared to when the first signal is routed around the first amplifier. However, the Vdac signal does not need now to travel the long distance from the DAC to the front buffer. Instead, the additional buffer is placed locally, therefore very close to the DAC. As a result, Vdac can settle much faster because the loop from the DAC via the second amplifier and the signal selector back to the SAR re-sampling stage is much shorter. The analog signal selector is controlled with appropriate signals and makes sure that first the input signal is passed to the unit ADC for sampling, and at a second phase it allows the Vdac signal to be directed to the ADC. The selector can be easily realized with simple switches.

In practice, the manufacturing process will cause the two amplifiers of this embodiment to have a slightly different behavior (mismatch). The end result is that for the same input signal applied to both amplifiers, the corresponding output signals are different. The main mismatch effects between the two amplifiers relate to offset and gain, both of which can be treated identically with the gain and offset mismatches of the DAC. That is, one of the two amplifiers can be calibrated compared to the other with proper additional circuitry with methods well established in literature. Alternatively and preferably, mismatches in the amplifiers can be included in the calibration of the DAC, when the SAR ADC (or other ADC using this invention) is incorporated in a Time Int. ADC. In this way, the two amplifiers will compress both Vin and Vdac similarly, therefore there will be no relative compression visible.

It will be immediately apparent to the skilled person at that the invention is not restricted to the use in Time Interleaved ADCs, or SAR ADCs only but it can apply to other converters affected by similar amplifier/buffer nonlinearity effects.

Operation of a partitioned, or hierarchical, interleaved ADC for use in accordance with the embodiment described here-in with reference to FIG. 10, is described in Applicant's co-pending European Patent Application EP08100434.3, the full contents of which are incorporated herein by reference, and in particular the description disclosed therein with reference to FIG. 5 of that application, reproduced herein as FIG. 12 and which is as follows (with reference numerals appropriately adjusted).

Figure 12:
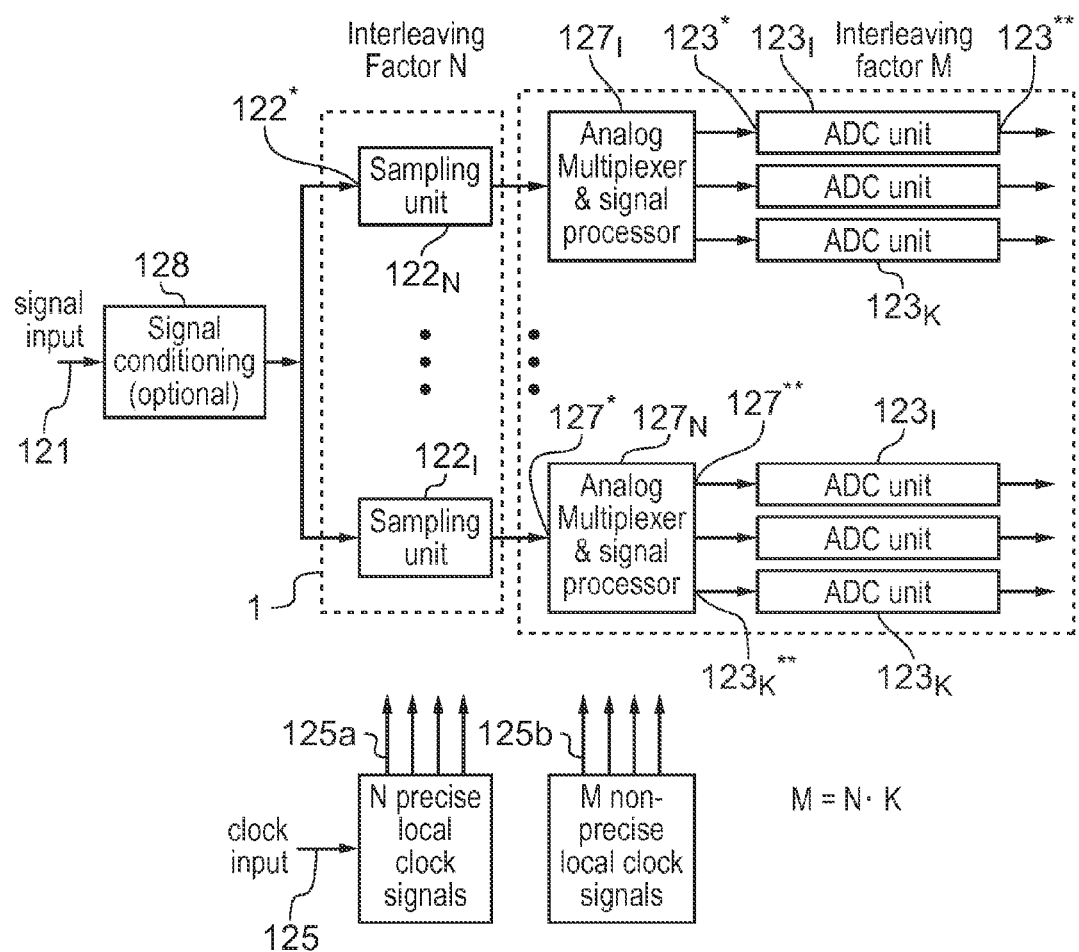
FIG. 12 shows a schematic of a time interleaved ADC.

An analog-to-digital converter architecture according to EP08100434.3 is shown in FIG. 12. It comprises a main signal input 121 for inputting an analog signal into the circuit. It further comprises a front-end circuitry 1 and a back-end circuitry 2. In turn, the front-end circuitry 1 comprises a plurality of N sampling units $122_1, \ldots, 122_N$ each having a signal input 122* and a signal output 122**, wherein the signal input 122* of each of the N sampling units $122_1, \ldots, 122_N$ is connected to the main signal input 121. Presently, a signal conditioning unit 128 is interposed between the main signal input 121 and the respective signal inputs 122* of the N individual sampling units $122_1, \ldots, 122_N$ of the front-end circuitry 1. The signal conditioning unit 128 may comprise a copier and/or a buffer. Signal conditioning units 128 of the kind used in the present converter architecture are well known in the art.

The back-end circuitry 2 of the analog-to-digital circuit according to the invention comprises a plurality N of analog demultiplexers $127_1, \ldots, 127_N$ each having an signal input 127* and a group of signal outputs $127_1^{}, \ldots 127_K^{}$ and a plurality N of groups of ADC units $123_1, \ldots, 123_K$, wherein each ADC unit $123_1, \ldots, 123_K$ has a signal input 123* for an analog signal and a data output 123** for binary data. Presently, the groups of ADC units $123_1, \ldots, 123_K$ each contain the same number K of ADC units $123_1, \ldots, 123_K$. Correspondingly, the total number of ADC units $123_1, \ldots, 123_K$ in the back-end circuitry 2 of the ADC converter architecture according to the present invention is M=N*K. According to the analog-to-digital converter architecture according to EP08100434.3 the demultiplexers $127_1, \ldots, 127_N$ and the ADC units $123_1, \ldots, 123_K$ are interconnected in such a way that the signal outputs $127_1^{}, \ldots 127_K^{}$ of each demultiplexer $127_1, \ldots, 127_N$ are connected to the signal inputs 123* of the ADC units $123_1, \ldots, 123_K$ of one group of ADC units $123_1, \ldots, 123_K$. What is more, the demultiplexers $127_1, \ldots, 127_N$ of the back-end circuitry 2 each comprise an additional signal processing circuit. In turn, these signal processing circuits may comprise a buffer and/or a follower and/or an amplifier.

Furthermore, the analog-to-digital converter architecture according to the analog-to-digital converter architecture according to EP08100434.3 comprises a clock input 1211 configured to provide a first plurality of clock signals 1211a clocking the plurality of sampling units $122_1, \ldots, 122_N$ and a second plurality of clock signals 1211b clocking the plurality N of groups K of ADC units $123_1, \ldots, 123_K$. Each clock signal of said the first plurality of clock signals 125a has a first degree of precision and each clock signal 125b of said second plurality of clock signals has a second degree of precision. Presently, the first degree of precision exceeds the second degree of precision since only the N sampling units $122_1, \ldots, 122_N$ of the front-end circuitry 1 require a precise clock signal, whereas the digitization partition of the analog-to-digital circuitry, i.e. the back-end circuitry 2 including the N groups of K ADC units $123_1, \ldots, 123_K$ allows for using a clock signal that is less precise. It should be noted that the sampling behavior for all members of the same ADC group is identical (the same timing error). Therefore relative timing errors within such a group do not exist.

Not shown in FIG. 12 is a data recombination unit that is configured to recombine the data being output by the data outputs 123** of the ADC units of said plurality N of groups of K ADC units $123_1, \ldots, 123_K$ so as to generate a one-dimensional digital data stream.

The analog-to-digital converter according to the analog-to-digital converter architecture according to EP08100434.3 operates as follows:

A signal source (not shown) provides an analog signal to the respective signal inputs 122* of the N sampling units $122_1, \ldots, 122_N$ via the signal conditioning unit 128. The N sampling units $122_1, \ldots, 122_N$ of the front-end circuitry 1 make samples of the analog signal at the required sampling rate $f_s$ using time interleaving by factor N determined by the number of sampling units $122_1, \ldots, 122_N$. The sampled signals of the N sampling units $122_1, \ldots, 122_N$ of the front-end circuitry 1 are each linked to the correct ADC units $123_1, \ldots, 123_K$ of the N groups of ADC units where they are converted to digital data using time interleaving (factor M). Although the back-end interleaving factor M exceeds factor N of the front-end interleaving (i.e. M>N) the partitioning of the ADC architecture according to the invention allows for the necessary timing correction between the individual ADC units of the back-end circuitry 2 to be reduced to the correction of N errors—N being the number of groups of ADC units $123_1, \ldots, 123_K$—since the sampling behaviour for all members of the same group of ADC units $123_1, \ldots, 123_K$ is identical and relative timing errors within one group do not exist.

It should be noted that the partitioning between two interleaving domains can be reflected also on the actual placement of the units on chip, with critical components being close to each other (sampling units) and non-critical ones far away without major penalties.

According to the analog-to-digital converter architecture according to EP08100434.3 architecture the front-end sampling and the back-end digitization operations are assigned different interleaving factors N, M optimized for the requirements of those partitions. The sampling partition (front-end circuitry 1) relates to precise timing and front-end signal bandwidth aspects. The digitization partition (back-end circuitry 2) relates to the internal bandwidth/dynamic-range/power tradeoff of each ADC unit $123_1, \ldots, 123_K$ and usually dominates the overall power consumption of the total analog-to-digital converter device.

From the present disclosure, it will be apparent that this invention relates to Analog to Digital Converters (ADC) and, inter alia, to Time Interleaved ADCs and Successive Approximation Register (SAR) ADC's. In a conventional Time Interleaved ADC employing SAR ADC units, the input signal is processed through a track-and-hold circuit (T/H), and then through a buffer circuit, before the SAR ADC unit. There, by means of a comparator, the signal is compared with a Digital-to-Analog Converter (DAC) signal from the SAR logic. The buffer reduces the influence of capacitive loading and physical layout design on the SAR ADC input, but typically has a non-linear response and thus introduces distortion to the input signal. This can limit the ADC linearity, particularly for high-speed ADCs operating with low-supply voltages.

Further, it will be apparent that an objective of the invention is to reduce or eliminate the effect of the buffer non-linearity. This is done in some embodiments by routing both the signals to the comparator through the same buffer circuit. In another embodiment the DAC signal is routed through a separate second buffer circuit. By use of a single buffer circuit, or where there is ideal matching of the buffer circuits in the latter embodiment, the distortion effects are completely eliminated; however, for practical imperfectly matched buffer circuits according to the latter embodiment, the gain and off-set mismatches can be accommodated through calibration of the buffers or, in suitable applications, through the DAC calibration.

From reading the present disclosure, other variations and modifications will be apparent to the skilled person. Such variations and modifications may involve equivalent and other features which are already known in the art of ADCs and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An ADC comprising:
   an ADC element having a device input, the ADC element including an ADC unit, a pre-conditioning unit connected between the device input and the ADC unit, and a DAC unit having a DAC output, and a signal selector unit connected between the input and the ADC unit and in series with the pre-conditioning unit and for selecting one of an element input signal and a signal from the DAC output
   wherein the ADC unit comprises at least one memory element and wherein the signal selector unit is connected between the pre-conditioning unit and the ADC unit, and further comprising a second pre-processor unit.

2. An ADC according to claim 1, wherein the signal selector unit is connected between the input and the pre-conditioning unit.

3. An ADC according to claim 2, wherein the ADC unit is a successive approximation register ADC unit.

4. An ADC according to claim 2, wherein the pre-conditioning unit is a buffer unit.

5. An ADC according to claim 2, wherein the pre-conditioning unit is an amplifier unit.

6. An ADC according to claim 2, wherein the DAC comprises a current-mode DAC.

7. An ADC according to claim 2, wherein the DAC comprises a switched-capacitor DAC.

8. An ADC according to claim 2, wherein the DAC comprises a resistor-string DAC.

9. An ADC according to claim 2, further comprising a track-and-hold unit connected to the signal selector and for receiving the device input and for supplying the element input signal.

10. An ADC according to claim 2, wherein the ADC comprises a time-interleaved ADC.

11. A time-interleaved ADC according to claim 9, wherein the track-and-hold unit is for supplying the element input signals to each of a plurality of ADC elements.

12. A time-interleaved ADC according to claim 10, comprising a plurality of track-and-hold units each for supplying the element input signal to at least one ADC element.

13. An ADC according to claim 1, wherein the ADC is a time-interleaved ADC and the ADC unit is a successive approximation register ADC unit.

14. An ADC comprising:
- an ADC element having a device input, the ADC element including a Successive Approximation Register (SAR) ADC unit, the SAR ADC including a comparator, SAR logic, and a DAC unit, the ADC element further including a pre-conditioning unit connected between the device input and the ADC unit, and the DAC unit having a DAC output, and a signal selector unit connected between the device input and the ADC unit and in series with the pre-conditioning unit and configured to select one of an element input signal from the device input and a signal from the DAC output of the SAR ADC, wherein the ADC unit comprises at least one memory element; and
- a track-and-hold unit connected between the signal selector and the device input to supply the element input signal to the signal selector.

15. An ADC according to claim 14, wherein the signal selector unit is connected between the input and the pre-conditioning unit.

16. An ADC according to claim 14, wherein the ADC comprises a time-interleaved ADC.

17. A time-interleaved ADC according to claim 16, wherein the track-and-hold unit is for supplying the element input signals to each of a plurality of ADC elements.

18. A time-interleaved ADC according to claim 16, comprising a plurality of track-and-hold units each for supplying the element input signal to at least one ADC element.

19. An ADC according to claim 14, wherein the signal selector unit is connected between the pre-conditioning unit and the ADC unit, and further comprising a second pre-processor unit.

20. An ADC according to claim 19, wherein the ADC is a time-interleaved ADC and the ADC unit is a successive approximation register ADC unit.

* * * * *